(12) United States Patent  
Smith

(10) Patent No.: US 9,246,415 B2  
(45) Date of Patent: Jan. 26, 2016

(54) ELECTROSTATIC CARRIER TRAY

(71) Applicant: Eryn Smith, Pleasanton, CA (US)

(72) Inventor: Eryn Smith, Pleasanton, CA (US)

( * ) Notice: Subject to any disclaimer, the term of this patent is extended or adjusted under 35 U.S.C. 154(b) by 134 days.

(21) Appl. No.: 13/737,221

(22) Filed: Jan. 9, 2013

(65) Prior Publication Data

US 2014/0055907 A1 Feb. 27, 2014

Related U.S. Application Data

(60) Provisional application No. 61/691,508, filed on Aug. 21, 2012.

(51) Int. Cl.
| | |
|---|---|
| *H02N 13/00* | (2006.01) |
| *H01L 21/673* | (2006.01) |
| *H01L 21/683* | (2006.01) |

(52) U.S. Cl.
CPC .......... *H02N 13/00* (2013.01); *H01L 21/67333* (2013.01); *H01L 21/6833* (2013.01)

(58) Field of Classification Search
CPC . H02N 3/00; H01L 21/67333; H01L 21/6833
USPC ........................................................ 361/234
See application file for complete search history.

(56) References Cited

U.S. PATENT DOCUMENTS

| | | | | |
|---|---|---|---|---|
| 5,637,930 | A  * | 6/1997 | Rowen et al. | 307/112 |
| 5,963,019 | A  * | 10/1999 | Cheon | 320/150 |
| 2007/0166134 | A1* | 7/2007 | Suzuki | 414/217 |
| 2012/0288619 | A1* | 11/2012 | Choi et al. | 427/66 |

FOREIGN PATENT DOCUMENTS

WO   WO 2009022508 A1 * 2/2009

* cited by examiner

*Primary Examiner* — Thienvu Tran  
*Assistant Examiner* — Kevin J Comber

(57) ABSTRACT

An electrostatic carrier tray is an apparatus that is used to temporarily grasp and to transport semiconductive coupons/wafers. The apparatus mainly includes a primary substrate, a plurality of electrostatics field generating circuits, a conformal coating, a structural backing, and a power-delivery and control system. The electrostatics field generating circuits are positioned on one side of the primary substrate, and the power delivery and control system is positioned on the other side of the primary substrate. The electrostatics field generating circuits are used to bond the semiconductive coupons/wafers to the apparatus. The structural backing is used to handle the apparatus while transporting the semiconductive coupons/wafers and is also used to protect the power-delivery and control system from physical damage. The conformal coating is superimposed onto the electrostatics field generating circuits and the primary substrate as a means of protection.

9 Claims, 9 Drawing Sheets

ELECTROSTATIC CARRIER TRAY

The current application claims a priority to the U.S. Provisional Patent application Ser. No. 61/691,508 filed on Aug. 21, 2012.

FIELD OF THE INVENTION

The present invention relates generally to a method and apparatus for a carrier. More specifically, the present invention is a method and apparatus for a mobile electric carrier device.

BACKGROUND OF THE INVENTION

With the advent of new technology, people are more reliant on electronic devices/systems in their daily routine. This causes an increase in manufacturing and producing of electronic devices and systems. Manufacturing and producing electronic devices require following stringent guidelines and strict procedures where oftentimes parts have to be transported and moved to various locations, process stations, and production plants. These parts and devices are made in many multiples of sizes and form factors, which causes manufacturers the need to maintain inventory of transport carriers (most commonly Joint Electron Devices Engineer Council (JEDEC) trays) that are specific to the device size and/-or process step in which it is involved, the devices need to be securely located and indexed in cavities in conventional trays. Causing manufactures the need to manage thousands or tens of thousands trays to fill all the size needs. Currently, there is no effective and easy way to move electronic substrates from one location to another. It is therefore an object of the present invention to provide an apparatus for a mobile electric carrier device that can easily and safely transport power electronic substrates and coupons with no size or form factor restrictions.

BRIEF DESCRIPTION OF THE DRAWINGS

FIG. 9 is a cross-sectional schematic of the present invention without the structural backing, wherein FIG. 9 is not proportional to the other figures.

DETAIL DESCRIPTIONS OF THE INVENTION

All illustrations of the drawings are for the purpose of describing selected versions of the present invention and are not intended to limit the scope of the present invention.

Figure 1:
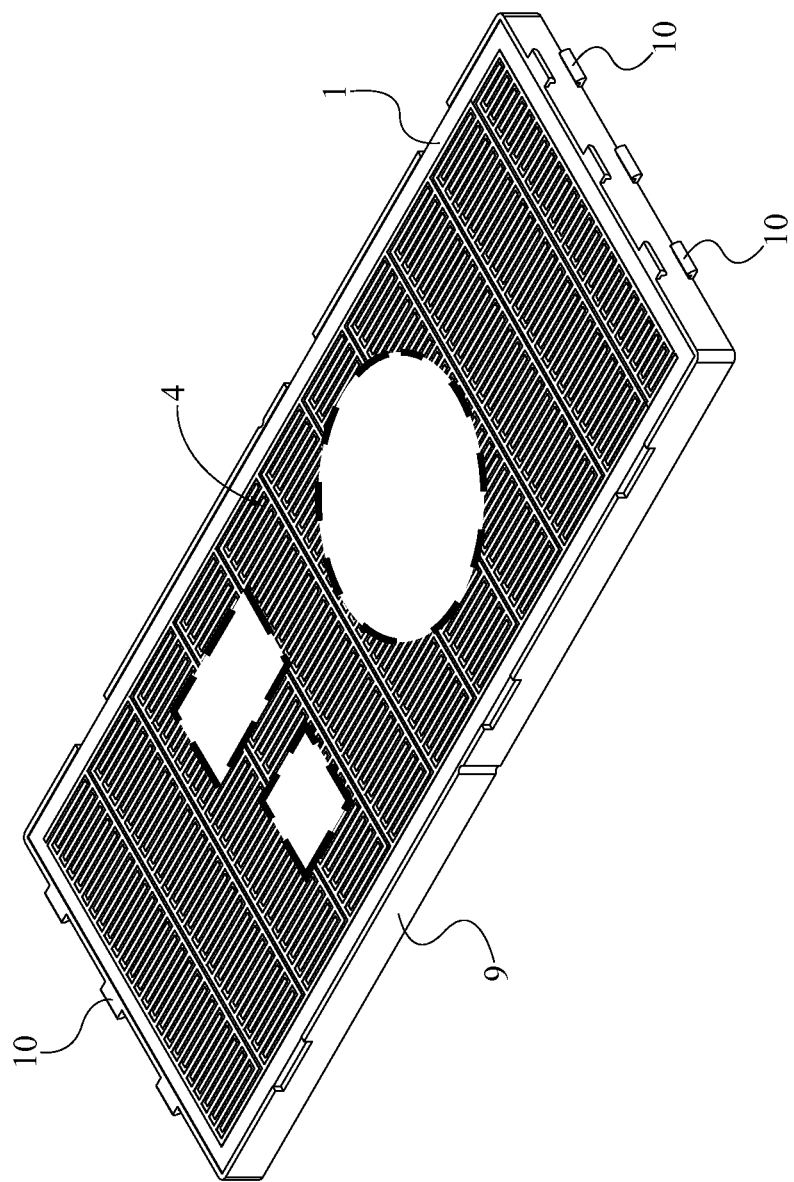
FIG. 1 is a perspective view of the present invention.
Figure 2:
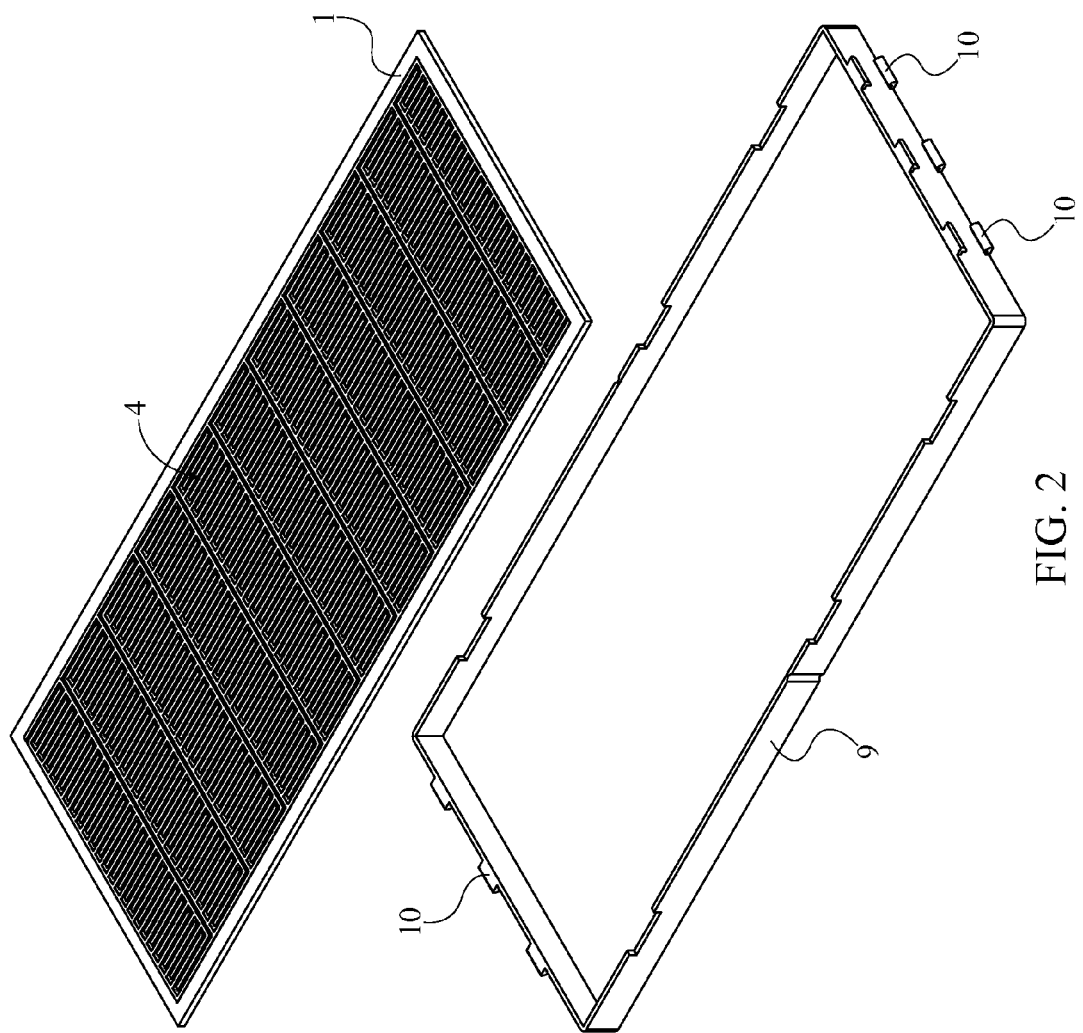
FIG. 2 is an exploded view of the present invention, wherein the primary substrate is separated from the tray.
Figure 3:
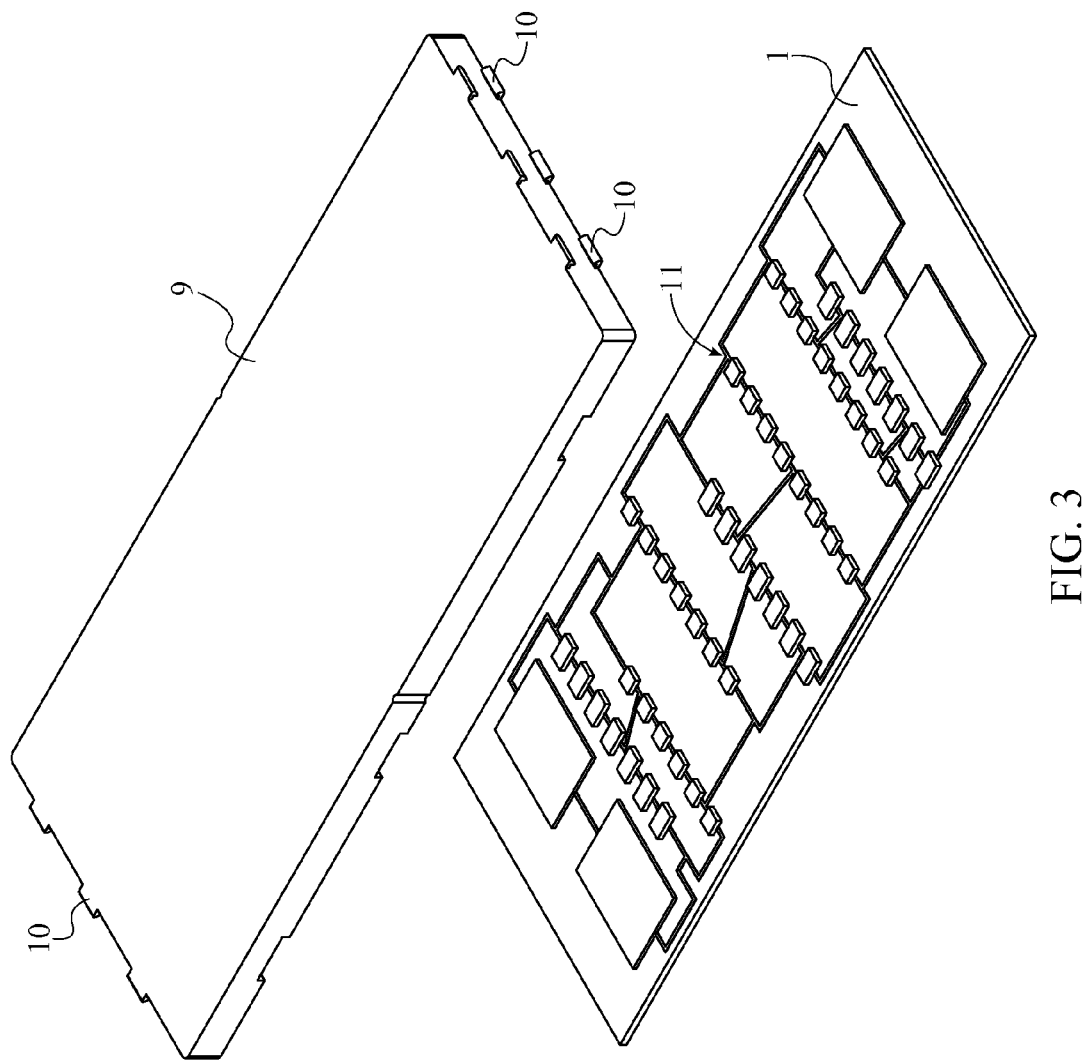
FIG. 3 is an upside-down exploded view of the present invention, wherein the primary substrate is separated from the structural backing.
Figure 9:
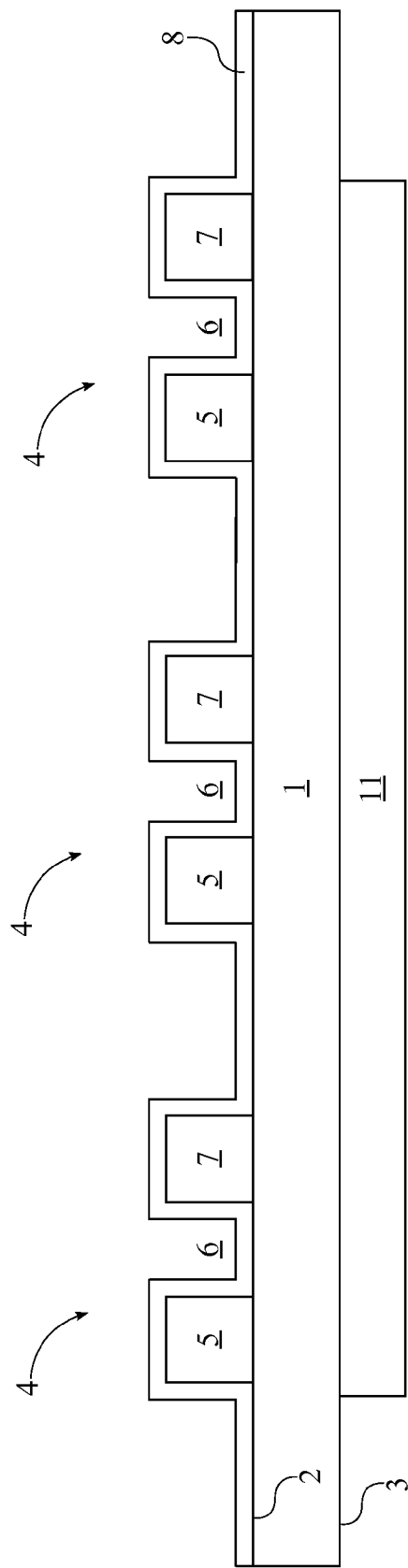

As can be seen in FIG. 1, the present invention is an electrostatic carrier tray, which is used to temporarily grasp and transport semiconductive wafers/coupons. A multitude of electrostatic carrier trays can be stacked on top of each other in order to increase the ease of transport or storage. The present invention can be used to bond and carry many different sizes of semiconductive wafers/coupons. The present invention mainly comprises a primary substrate 1, a plurality of electrostatic field generating (EFG) circuits 4, a conformal coating 8, a structural backing 9, and a power-delivery and control system 11, which are shown in FIGS. 2, 3, and 9. The primary substrate 1 is the base component for the present invention and is used to support the semiconductive wafers/coupons from the bottom. The plurality of EFG circuits 4 is used to temporarily bond the semiconductive wafers/coupons to the primary substrate 1. Once the present invention is loaded with and bonded to these semiconductive wafers/coupons, the plurality of EFG circuits 4 can keep the semiconductive wafers/coupons bonded to the present invention, even with a "g" of force being applied to the present invention. Also, if the present invention is held upside down, the plurality of EFG circuits 4 should still be able to keep the semiconductive wafers/coupons bonded to the present invention. Finally, a pick-and-place robot can easily remove each of the semiconductive wafers/coupons off the primary substrate 1 when the power for the present invention is turned off. The conformal coating 8 protects the plurality of EFG circuits 4 from being damaged by different semiconductive wafers/coupons, which are in constant contact with the plurality of EFG circuits 4. The power-delivery and control system 11 is used to provide the plurality of EFG circuits 4 with the proper amount of the electrical power in order to temporarily bond the semiconductive wafers/coupons to the present invention. The power-delivery and control system 11 is enclosed in between the primary substrate 1 and the structural backing 9. The structural backing 9 is also shaped for stacking one electrostatic carrier tray onto another electrostatic carrier tray.

Figure 4:
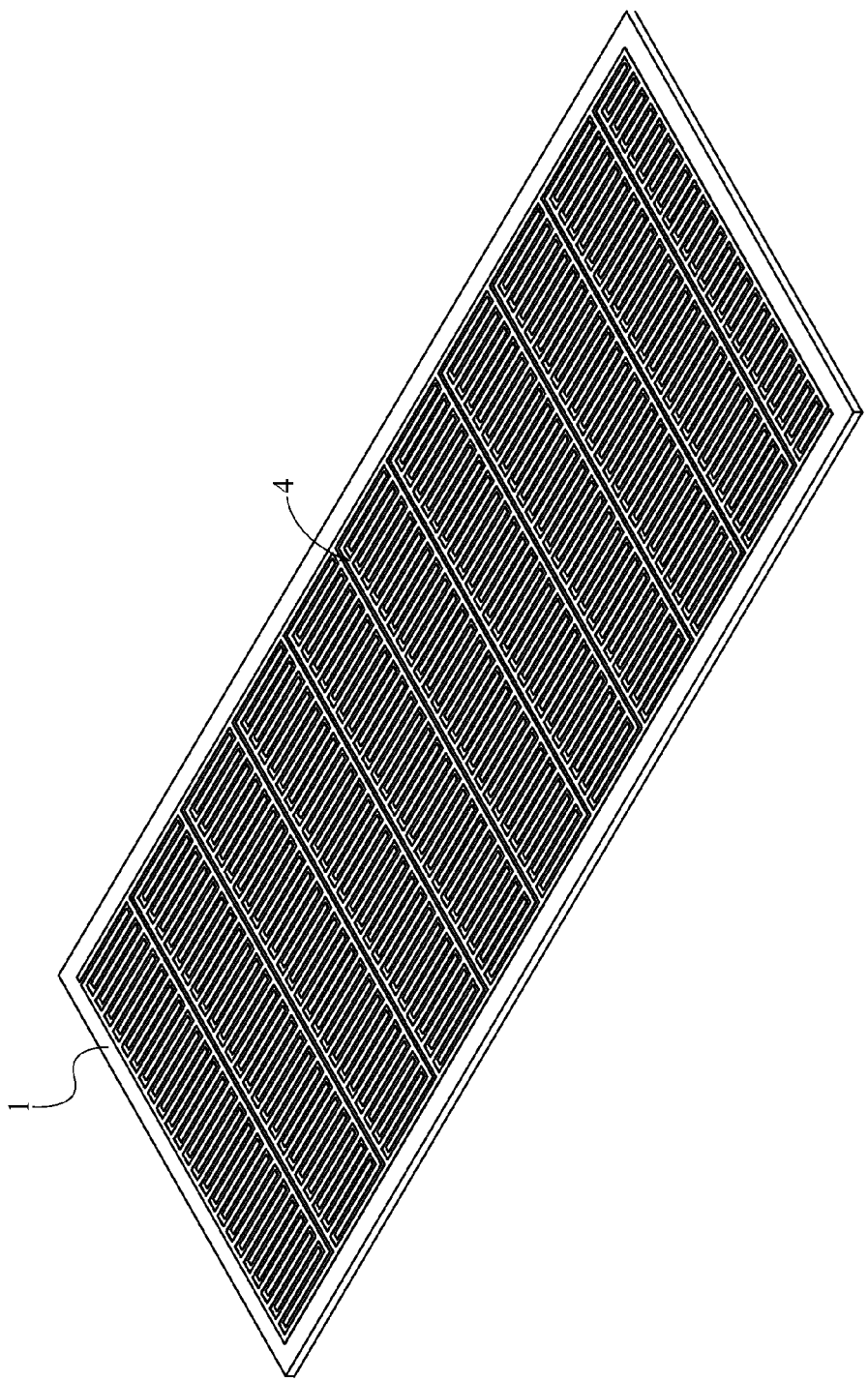
FIG. 4 is a perspective view of the present invention without the structural backing.
Figure 5:
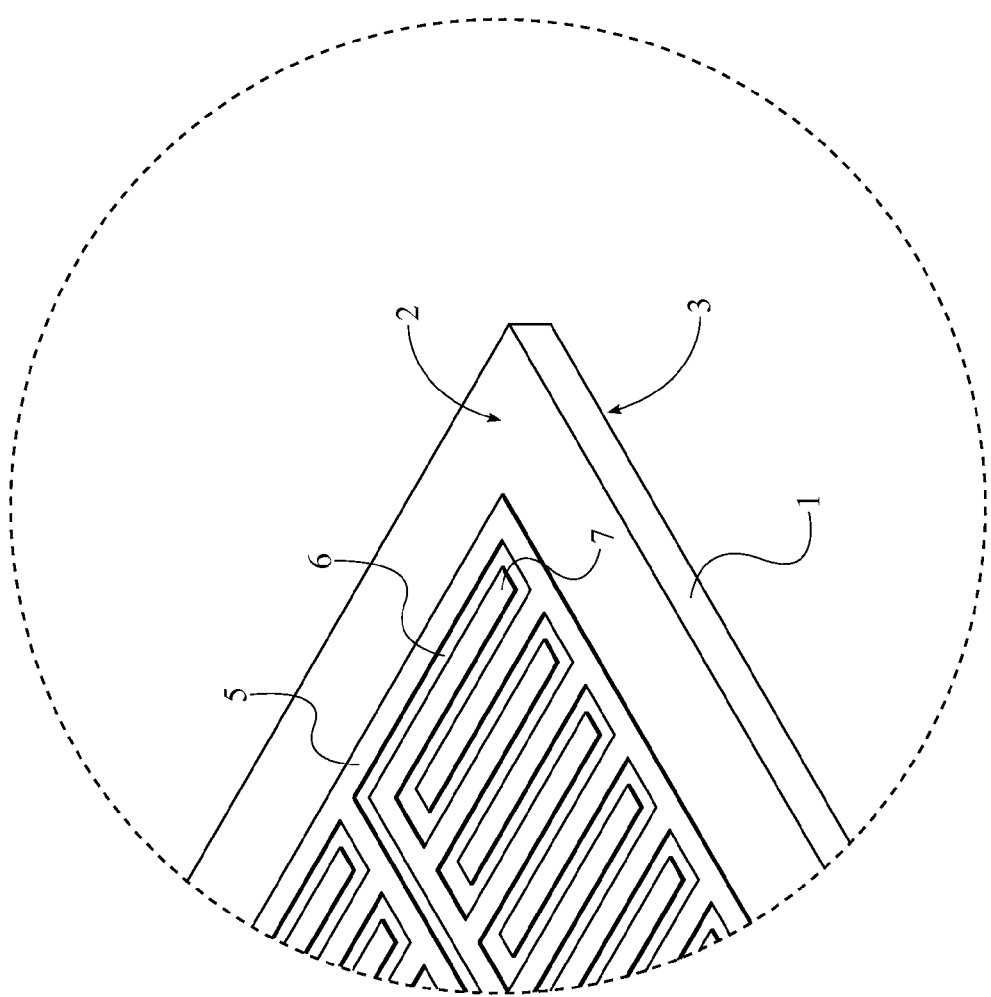
FIG. 5 is a magnified view of a section of the present invention.
Figure 6:
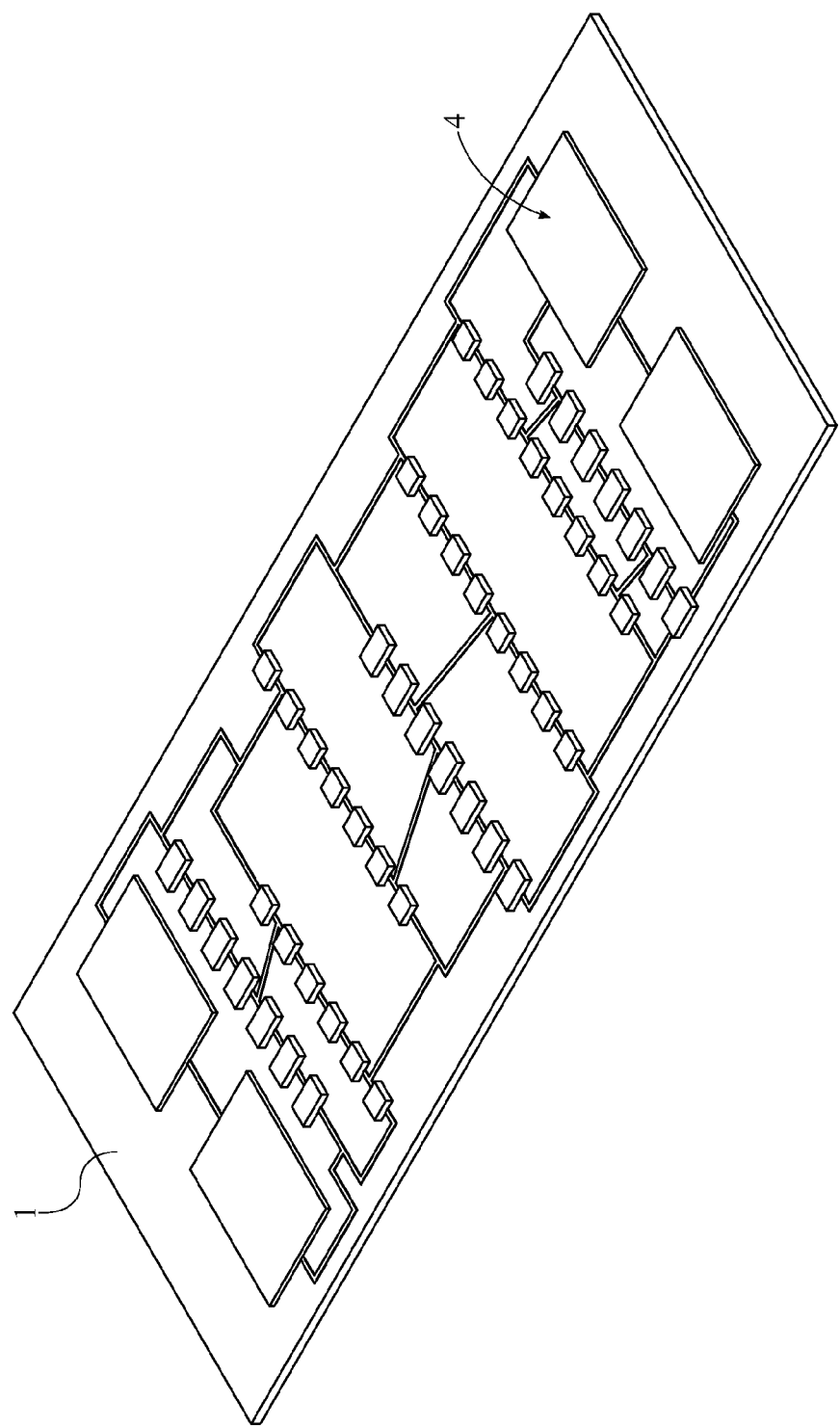
FIG. 6 is an upside-down perspective view of the present invention without the tray.

The components of the present invention are configured around the primary substrate 1 and are illustrated in FIGS. 4 and 6. The primary substrate 1 is either made of a highly insulative material such as Polytetrafluoroethylene (PTFE) or made of a high dielectric strength material such as Polyimide, fiberglass epoxy, ceramic, and glass. The primary substrate 1 can be design in many different form factors or sizes to appropriately accommodate any application or purpose. Consequently, the primary substrate 1 prevents the bonding energy from the plurality of EFG circuits 4 from affecting the other components of the present invention. As can be seen in FIGS. 5 and 9, the primary substrate 1 comprises a first surface 2 and a second surface 3, which are positioned opposite to each other on the primary substrate 1. The plurality of EFG circuits 4 is positioned onto and across the first surface 2 so that the semiconductive wafers/coupons can be bonded to any portion of the first surface 2. The plurality of EFG circuits 4 is also adhered to the first surface 2. The conformal coating 8 is layered onto and across both the plurality of EFG circuits 4 and the first surface 2. The conformal coating 8 is known in the art as any coating that laminates both the plurality of EFG circuits 4 and the first surface 2. The conformal coating 8 consists of a material that prevents each of the plurality of EFG circuits 4 from electrically interacting with each other. The material for the conformal coating 8 is also used to protect the plurality of the EFG circuits 4 from a harsh environment i.e. chemical or thermal. Most importantly, the conformal coating 8 prevents an electrical path from forming through the semiconductive wafers/coupons while those semiconductive wafers/coupons are bonded to the present invention. In the preferred embodiment of the present invention, the conformal coating 8 can be made of PEEK (polyether etherketone) or PTFE. The power-delivery and control system 11 is connected to the second surface 3 so that the primary substrate 1 is located in between the plurality of EFG circuits 4 and the power-delivery and control system 11. Consequently, the primary substrate 1 protects the power-delivery and control system 11 from the bonding energy of the plurality of EFG circuits 4.

Figure 7:
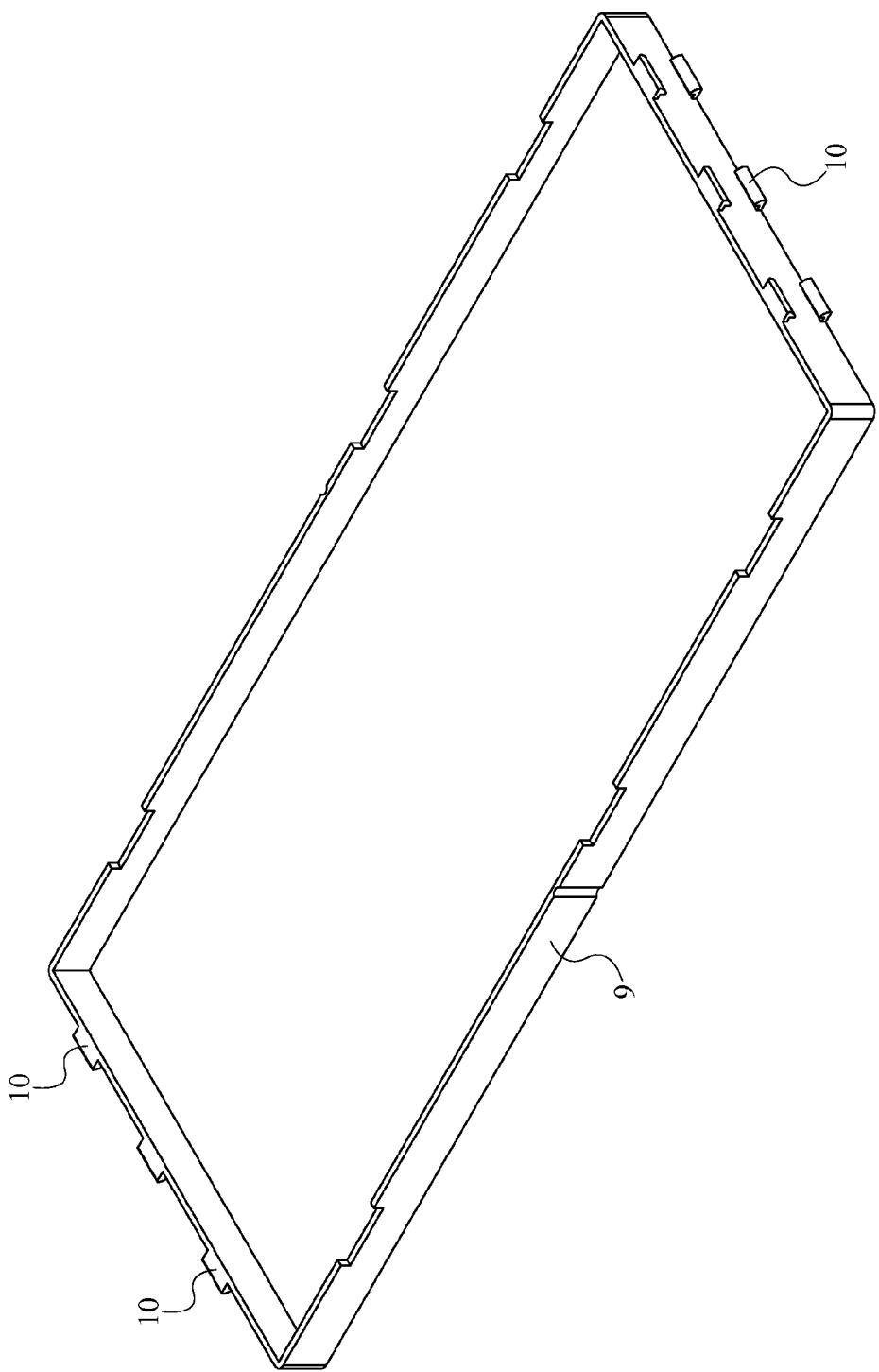
FIG. 7 is a perspective view of just the structural backing for the present invention.

As can be seen in FIG. 7, the structural backing 9 protects the electronic components of the power-delivery and control system 11 from physically damage and allows a multitude of the present invention to be stacked onto each other. In order to protect the power-delivery and control system 11 from physical damage, the power-delivery and control system 11 must be enclosed by the structural backing 9. In addition, the structural backing 9 is connected to the primary substrate 1, but the structural backing 9 can only connect to either the second surface 3 or the lateral edge of the primary substrate 1 because the entire area of the first surface 2 is only used to bond the semiconductive wafers/coupons to the present invention. In order to stack a multitude of the present invention, the structural backing 9 of one electrostatic carrier tray must be shaped to receive and secure the structural backing 9 of another electrostatic carrier tray. In addition, the structural backing 9 comprises a plurality of grasping tabs 10, which are used by industry-standard pick-and-place robots to securely grasp the present invention and to move the present invention. The plurality of grasping tabs 10 is laterally positioned around the structural backing 9, which allows these pick-and-place robots to properly grasp the present invention without damaging the semiconductive wafers/coupons.

Each of the plurality of EFG circuits 4 will use an electrostatics field to hold the semiconductive wafers/coupons on the first surface 2. For the present invention, the plurality of EFG circuits 4 will apply a greater bonding energy on materials with a lower resistivity. Conceptually, materials with a lower resistivity have more impurities, and the electrostatic field lines emanating from the plurality of EFG circuits 4 can more easily grasp onto these impurities in a material. For example, semiconductive materials or aluminum have a relatively large amount of impurities, and, thus, the plurality of EFG circuits 4 can more easily bond with semiconductive materials or aluminum. However, pure materials such as quartz, sapphire, or diamond have a relatively small amount of impurities, and, thus, the plurality of EFG circuits 4 cannot easily bond to quartz, sapphire, or diamond. In addition, the plurality of EFG circuits 4 are positioned and configured as an interdigital array, which properly spaces the small electrostatic field created by each EFG circuit so that the entire area of the first surface 2 is available for bonding the semiconductive wafers/coupons to the present invention. In the preferred embodiment of the present invention, the plurality of EFG circuits 4 is made of cupronickel (Ni—Cu) or any other low resistivity material.

In order to create the small electrostatic field, each of the plurality of EFG circuits 4 comprises a first antenna 5, a specified gap 6, and a second antenna 7. The first antenna 5 and the second antenna 7 are specifically used to create an electrostatic field by providing the first antenna 5 with a positive charge and the second antenna 7 with a negative charge or vice versa. The first antenna 5 is positioned adjacent and parallel to the second antenna 7, which allows the present invention to generate the small electrostatics field between the first antenna 5 and the second antenna 7. The specified gap 6 is positioned in between the first antenna 5 and the second antenna 7, and the small electrostatics field is generated across the specified gap 6. The size of the specified gap 6 is determined by two factors: the size of semiconductive wafers/coupons being carried by the present invention and the operational voltage range of the present invention. The size of the semiconductive wafers/coupons determines the size of the specified gap 6 because the present invention can grasp a smaller semiconductive wafer/coupon with a smaller specified gap 6 between the first antenna 5 and the second antenna 7. However, a smaller specified gap 6 would more likely cause a corona discharge between the first antenna 5 and the second antenna 7. The operational voltage range of the present invention also determines the size of the specified gap 6 because the present invention can more securely grasp a semiconductive wafer/coupon with a higher operational voltage range. However, a higher operational voltage range would more likely cause a corona discharge between the first antenna 5 and the second antenna 7. The present invention should be designed to adequately grasp the semiconductive wafers/coupons without causing a corona discharge by selecting the appropriate size for the specified gap 6 and by selecting the appropriate operational voltage for the present invention. The appropriate size for the specified gap 6 and the appropriate operational voltage are also chosen to accommodate a specific size or kind of semiconductive coupon/wafer.

Figure 8:
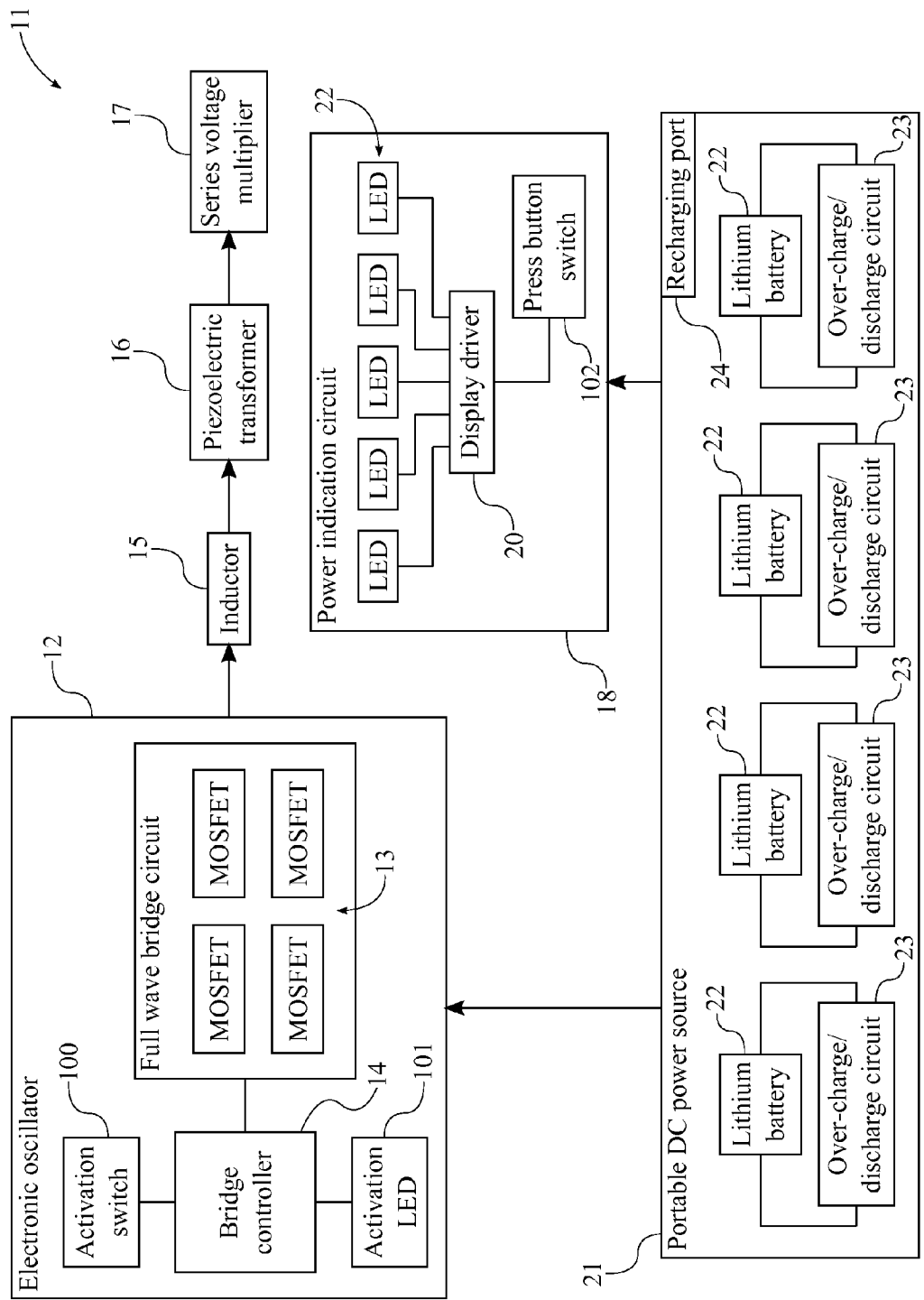
FIG. 8 is a block diagram of the power-delivery and control system for the present invention.

The power-delivery and control system 11 is used to supply the present invention with the appropriate operational voltage. The present invention must produce a high DC voltage to power the plurality of EFG circuits 4 through a relatively small apparatus for the power-delivery and control system 11. The power-delivery and control system 11 needs to be confined to a small apparatus because a multitude of the present invention needs to be stackable onto each other. In the preferred embodiment of the present invention, the electronic components of the power-delivery and control system 11 should have a height of less than 1 millimeter. The power-delivery and control system 11 comprises an electronic oscillator 12, a piezoelectric transformer 16, a series voltage multiplier 17, a power indication circuit 18, and a portable direct current (DC) power source 21, which are shown in FIG. 8. The portable DC power source 21 is used to provide the present invention with a constant electrical power source so that the semiconductive wafers/coupons are properly bonded to the present invention throughout the entire transportation process. The power-delivery and control system 11 is designed to multiply the relatively low voltage of the portable DC power source 21 into the high DC voltage that is capable of powering the plurality of EFG circuits 4. The portable DC power source 21 is electrically connected to the electronic oscillator 12 so that the electronic oscillator 12 can convert direct current from the portable DC power source 21 into an alternating current (AC) signal. The electronic oscillator 12 is designed to produce the AC signal as a perfect sine wave. The electronic oscillator 12 is electronically connected to the piezoelectric transformer 16 through an inductor 15. Together, the inductor 15 and the piezoelectric transformer 16 act as a LC circuit, which is used to tune the frequency of the input AC signal to the resonant frequency of the lead zirconate titanate (PZT) element within the piezoelectric transformer 16. The piezoelectric transformer 16 produces an output AC signal at a higher voltage by oscillating and driving the PZT element at its resonant frequency with the input AC signal. In the preferred embodiment of the present invention, the piezoelectric transformer 16 will resonate and produce a very high voltage gain from about 50 to 75. For example, an input AC signal at 12 Volts can produce an output AC signal of 600 Volts through a piezoelectric transformer 16 with a voltage gain of 50. The piezoelectric transformer 16 also has a 90% transfer efficiency rate, which allows the present invention to amplify 90% of the energy from the input AC signal.

The piezoelectric transformer 16 is then electronically connected to the series voltage multiplier 17 in order to multiply and rectify the output AC signal from the piezoelectric transformer 16. Thus, the series voltage multiplier 17 converts the output AC signal into a higher DC voltage, which is used to electrically power the plurality of EFG circuits 4. Consequently, the series voltage multiplier 17 is electronically connected to the plurality of EFG circuits 4. The series voltage multiplier 17 has a standard electronic configuration of capacitors and diodes. Each stage of the series voltage multiplier 17 functions by charging a capacitor while one diode is off and then by discharging back to the diode. In addition, the power-delivery and control system 11 does not comprise a discharge circuit so that the plurality of EFG circuits 4 maintains enough charge to hold the semiconductive wafers/coupons on the primary substrate 1 in case of a battery failure or low power situation.

The electronic oscillator 12 driving the amplification stage of the power-delivery and control system 11 has a specific circuit configuration. In the preferred embodiment of the present invention, the electronic oscillator 12 is a full wave bridge driver. The electronic oscillator 12 comprises four metal-oxide-semiconductors field-effect transistors (MOSFET) 13, a bridge controller 14, an activation switch 100, and an activation light emitting diode (LED) 101. The four MOSFETs 13 are electronically arranged as a full wave bridge circuit, which is able to convert the direct current from the portable DC power source 21 into an AC signal by basically turning on and off each of the four MOSFETs 13 at a high frequency. The voltage of the output AC signal from the piezoelectric transformer 16 can be controlled by adjusting the duty cycle of the four MOSFETs 13. In the preferred embodiment of the present invention, the electronic oscillator 12 can produce an AC signal at a frequency between 60 to 200 kHz. The bridge controller 14 is electronically connected to the full wave bridge circuit and is used to control when each of the four MOSFETs 13 turns on or off while the full wave bridge oscillator is generating the AC signal. The activation switch 100 is electronically connected to the bridge controller 14 and is used to initiate the process of producing the AC signal with the electronic oscillator 12. Also in the preferred embodiment, the activation switch 100 is a magnetic reed switch. The activation LED 101 is electronically connected to the bridge controller 14 so that the bridge controller 14 illuminates the activation LED 101 during the process of producing the AC signal with the full bridge wave controller.

The portable DC power source 21 provides electrical power to all of the electronic components of the present invention. The portable DC power source 21 needs to be compact and reliable because the present invention is used for transportation. The portable DC power source 21 can have any battery topology or super capacitor topology, but, in the preferred embodiment of the present invention, the portable DC power source 21 comprises a plurality of lithium batteries 22 and a recharging port 24. The plurality of lithium batteries 22 is electrically connected to the recharging port 24 so that the plurality of lithium batteries 22 can be recharged while the present invention is in standby and is not being transported. The recharging port 24 can be accessed by a standard power outlet and power cord. Each of the plurality of lithium batteries 22 comprises an over-charge/over-discharge protection circuit 23. The over-charge/over-discharge protection circuit 23 is used to prevent each lithium battery from going above or below a certain charge range. Otherwise, a lithium battery could experience a run-away chemical chain reaction and could combust or catch on fire. In the preferred embodiment, the over-charge/over-discharge protection circuit 23 includes a monitoring chip, which has a transistor to by-pass its respective lithium battery if the respective lithium battery reaches dangerous levels. Each monitoring chip is also used to manage the amount of electrical power entering its respective lithium battery by gating the electrical power from the recharging port through two transistors.

The power indication circuit 18 is used to display the total amount of remaining power within the plurality of lithium batteries 22, and, thus, the portable DC power source 21 is electrically connected to the power indication circuit 18. The power indication circuit 18 comprises a press button switch 102, a display driver 20, and a plurality of LEDs 19. The display driver 20 is electronically connected to the plurality of LEDs 19, which are serially positioned with each other. The display driver 20 activates a certain amount of the plurality of LEDs 19 to proportionately display the total amount of remaining power within the plurality of lithium batteries 22. In the preferred embodiment of the present invention, the plurality of LEDs 19 can be color coordinated to proportionately display the total amount of remaining power. For example, a red-colored LED can indicate low power, a yellow-colored LED can indicate moderate power, and a green-colored LED can indicate full power. The press button switch 102 is electronically connected to the display driver 20 so that the plurality of LEDs 19 is only illuminated when the press button switch 102 is activated by a user.

Although the invention has been explained in relation to its preferred embodiment, it is to be understood that many other possible modifications and variations can be made without departing from the spirit and scope of the invention as hereinafter claimed.

What is claimed is:

1. An electrostatic carrier tray comprises,
   a primary substrate;
   a plurality of electrostatic field generating circuits;
   a conformal coating;
   a structural backing;
   a power-delivery and control system;
   said primary substrate comprises a first surface and a second surface;
   each of said plurality of electrostatic field generating circuits comprises a first antenna, a specified gap, and a second antenna;
   said power-delivery and control system comprises an electronic oscillator, an inductor, a piezoelectric transformer, a series voltage multiplier, a power indication circuit, and a portable direct current (DC) power source;
   said power indication circuit comprises a plurality of light emitting diodes (LED), a press button switch, and a display driver;
   said portable DC power source being electrically connected to said electronic oscillator;
   said electronic oscillator being electronically connected to said piezoelectric transformer through said inductor;
   said piezoelectric transformer being electronically connected to said series voltage multiplier;
   said series voltage multiplier being electronically connected to said plurality of electrostatic field generating circuits;
   said electronic oscillator comprises four metal-oxide-semiconductors field-effect transistors (MOSFET), a bridge controller, an activation switch, and an activation light emitting diode (LED);
   said four MOSFETs being electronically arranged as a full wave bridge circuit;
   said bridge controller being electronically connected to said full wave bridge circuit;

said activation switch being electronically connected to said bridge controller;
said activation LED being electronically connected to said bridge controller;
said first surface and said second surface being positioned opposite to each other on said primary substrate;
said plurality of electrostatic field generating circuits being positioned onto and across said first surface;
said plurality of electrostatic field generating circuits being adhered to said first surface;
said conformal coating being layered onto and across both said plurality of electrostatic field generating circuits and said first surface;
said power-delivery and control system being connected to said second surface;
said plurality of electrostatic field generating circuits being positioned and configured as an interdigital array;
said first antenna being positioned adjacent and parallel to said second antenna; and
said specified gap being positioned in between said first antenna and said second antenna.

2. The electrostatic carrier tray as claimed in claim 1 comprises,
said power-delivery and control system and said second surface being enclosed by said structural backing;
said structural backing being connected to said primary substrate;
said structural backing comprises a plurality of grasping tabs; and
said plurality of grasping tabs being laterally positioned around said structural backing.

3. The electrostatic carrier tray as claimed in claim 1 comprises,
said portable DC power source being electrically connected to said power indication circuit;
said portable DC power source being a plurality of lithium batteries and a recharging port;
said recharging port being electrically connected to said plurality of lithium batteries; and
each of said plurality of lithium batteries comprises an over-charge/over-discharge protection circuit.

4. The electrostatic carrier tray as claimed in claim 3 comprises,
said press button switch being electronically connected to said display driver;
said display driver being electronically connected to each of said plurality of LEDs; and
said plurality of LEDs being serially positioned with each other.

5. An electrostatic carrier tray comprises,
a primary substrate;
a plurality of electrostatic field generating circuits;
a conformal coating;
a structural backing;
a power-delivery and control system;
said primary substrate comprises a first surface and a second surface;
each of said plurality of electrostatic field generating circuits comprises a first antenna, a specified gap, and a second antenna;
said power-delivery and control system comprises an electronic oscillator, a piezoelectric transformer, an inductor, a series voltage multiplier, a power indication circuit, and a portable direct current (DC) power source;
said power indication circuit comprises a plurality of light emitting diodes (LED), a press button switch, and a display driver;
said first surface and said second surface being positioned opposite to each other on said primary substrate;
said plurality of electrostatic field generating circuits being positioned onto and across said first surface;
said plurality of electrostatic field generating circuits being adhered to said first surface;
said conformal coating being layered onto and across both said plurality of electrostatic field generating circuits and said first surface;
said power-delivery and control system being connected to said second surface;
said plurality of electrostatic field generating circuits being positioned and configured as an interdigital array;
said first antenna being positioned adjacent and parallel to said second antenna;
said specified gap being positioned in between said first antenna and said second antenna;
said portable DC power source being electrically connected to said electronic oscillator;
said electronic oscillator being electronically connected to said piezoelectric transformer through said inductor;
said piezoelectric transformer being electronically connected to said series voltage multiplier;
said series voltage multiplier being electronically connected to said plurality of electrostatic field generating circuits;
said electronic oscillator comprises four metal-oxide-semiconductors field-effect transistors (MOSFET), a bridge controller, an activation switch, and an activation light emitting diode (LED);
said four MOSFETs being electronically arranged as a full wave bridge circuit; said bridge controller being electronically connected to said full wave bridge circuit; said activation switch being electronically connected to said bridge controller; and
said activation LED being electronically connected to said bridge controller.

6. The electrostatic carrier tray as claimed in claim 5 comprises,
said power-delivery and control system and said second surface being enclosed by said structural backing;
said structural backing being connected to said primary substrate;
said structural backing comprises a plurality of grasping tabs; and
said plurality of grasping tabs being laterally positioned around said structural backing.

7. The electrostatic carrier tray as claimed in claim 5 comprises,
said portable DC power source being electrically connected to said power indication circuit;
said portable DC power source being a plurality of lithium batteries and a recharging port;
said recharging port being electrically connected to said plurality of lithium batteries;
each of said plurality of lithium batteries comprises an over-charge/over-discharge protection circuit;
said press button switch being electronically connected to said display driver;
said display driver being electronically connected to each of said plurality of LEDs; and
said plurality of LEDs being serially positioned with each other.

8. An electrostatic carrier tray comprises,
a primary substrate;
a plurality of electrostatic field generating circuits;
a conformal coating;

a structural backing;
a power-delivery and control system;
said primary substrate comprises a first surface and a second surface;
each of said plurality of electrostatic field generating circuits comprises a first antenna, a specified gap, and a second antenna;
said power-delivery and control system comprises an electronic oscillator, an inductor, a piezoelectric transformer, a series voltage multiplier, a power indication circuit, and a portable direct current (DC) power source;
said power indication circuit comprises a plurality of light emitting diodes (LED), a press button switch, and a display driver;
said portable DC power source being electrically connected to said electronic oscillator;
said electronic oscillator being electronically connected to said piezoelectric transformer through said inductor;
said piezoelectric transformer being electronically connected to said series voltage multiplier;
said series voltage multiplier being electronically connected to said plurality of electrostatic field generating circuits;
said electronic oscillator comprises four metal-oxide-semiconductors field-effect transistors (MOSFET), a bridge controller, an activation switch, and an activation light emitting diode (LED);
said four MOSFETs being electronically arranged as a full wave bridge circuit;
said bridge controller being electronically connected to said full wave bridge circuit;
said activation switch being electronically connected to said bridge controller;
said activation LED being electronically connected to said bridge controller;
said portable DC power source being electrically connected to said power indication circuit;
said portable DC power source being a plurality of lithium batteries and a recharging port;
said recharging port being electrically connected to said plurality of lithium batteries;
each of said plurality of lithium batteries comprises an over-charge/over-discharge protection circuit;
said press button switch being electronically connected to said display driver;
said display driver being electronically connected to each of said plurality of LEDs; and
said plurality of LEDs being serially positioned with each other.

9. The electrostatic carrier tray as claimed in claim 8 comprises,
said first surface and said second surface being positioned opposite to each other on said primary substrate;
said plurality of electrostatic field generating circuits being positioned onto and across said first surface;
said plurality of electrostatic field generating circuits being adhered to said first surface;
said conformal coating being layered onto and across both said plurality of electrostatic field generating circuits and said first surface;
said power-delivery and control system being connected to said second surface;
said power-delivery and control system and said second surface being enclosed by said structural backing;
said structural backing being connected to said primary substrate;
said structural backing comprises a plurality of grasping tabs;
said plurality of grasping tabs being laterally positioned around said structural backing;
said plurality of electrostatic field generating circuits being positioned and configured as an interdigital array;
said first antenna being positioned adjacent and parallel to said second antenna; and
said specified gap being positioned in between said first antenna and said second antenna.

* * * * *